United States Patent
Ishikawa

Patent Number: 5,115,241
Date of Patent: May 19, 1992

[54] PREDICTIVE CODING DEVICE WITH INCREASED RESOLUTION

[75] Inventor: Hisashi Ishikawa, Yokohama, Japan

[73] Assignee: Canon Kabushiki Kaisha, Tokyo, Japan

[21] Appl. No.: 535,139

[22] Filed: Jun. 8, 1990

[30] Foreign Application Priority Data

Jun. 9, 1989 [JP] Japan .................. 1-147809

[51] Int. Cl.⁵ .................. H03M 3/00; H04B 14/04
[52] U.S. Cl. .................. 341/143; 375/25; 341/106
[58] Field of Search .......... 341/143, 75, 76, 106; 375/25, 27, 28; 358/136

[56] References Cited

U.S. PATENT DOCUMENTS

| | | | |
|---|---|---|---|
| 3,772,682 | 11/1973 | Flanagan | 341/75 |
| 4,375,013 | 2/1983 | Cointot et al. | 341/143 |
| 4,385,393 | 5/1983 | Chaure et al. | 341/143 |
| 4,470,146 | 9/1984 | Yatsuzuka et al. | 341/143 |
| 4,518,950 | 5/1985 | Petr | |
| 4,519,085 | 5/1985 | Catros | 341/143 |
| 4,542,516 | 9/1985 | Weirich | |
| 4,592,070 | 5/1986 | Chow et al. | 341/143 |
| 4,654,863 | 3/1987 | Belfield et al. | 341/143 |
| 4,788,692 | 11/1988 | Takebayshi et al. | 341/143 |
| 4,797,653 | 1/1989 | Takayama | 341/143 |
| 4,807,250 | 2/1989 | Tanaka | 341/143 |
| 4,853,780 | 8/1989 | Kojima et al. | 341/143 |
| 4,979,187 | 12/1990 | Aoki et al. | 375/27 |
| 4,995,059 | 2/1991 | Ishikawa | 341/106 |

*Primary Examiner*—William M. Shoop, Jr.
*Assistant Examiner*—Helen Kim
*Attorney, Agent, or Firm*—Fitzpatrick, Cella, Harper & Scinto

[57] ABSTRACT

There is provided a coding device in which when a difference value between a sample value and a predictive value is quantized into a coding code of n bits, in the case of quantizing by a quantization unit which can output $(2^{n-1}-1)$ coding codes corresponding to positive quantization representative values, $(2^{n-1}-1)$ coding codes corresponding to negative quantization representative values, and an additional coding code corresponding to the quantization representative value of the difference value 0, the one remaining coding code is selective made to correspond to the positive or to the negative quantization representative values, respectively.

13 Claims, 2 Drawing Sheets

PREDICTIVE CODING DEVICE WITH INCREASED RESOLUTION

BACKGROUND OF THE INVENTION

1. Field of the Invention

The present invention relates to a coding device and, more particularly, to a device for coding digital data such as an audio signal, a video signal or the like having a correlation among data.

2. Related Background Art

Various kinds of coding methods have been proposed as a method of narrowing a transmission band, that is, a method of reducing the amount of transmission information in the case of digitally transmitting information such as a video signal or audio signal. For instance, there has been known a predictive coding method (DPCM) for compressing information amount by using the correlation between adjacent sample values. In the DPCM, a predictive value for a sample value to be coded is obtained from a decoded value of a coding code which is transmitted, a difference value (predictive error) between the predictive value and the sample value is quantized, and the coding code obtained by such a quantization is transmitted. Various predictive coding methods are provided in accordance with a method of producing the predictive value. Among them, FIG. 1 is a block diagram showing a fundamental construction of a coding device of the simplest previous value predictive coding method (predictive coding method which uses a preceding decoded value as a predictive value).

In FIG. 1, a subtracter 12 subtracts a predictive value $x_{ip}$ (previous value decoded value in the embodiment of FIG. 1) from a sample value $x_i$ which is input to an input terminal 10 and outputs a difference value $e_i$. A quantization unit 14 quantizes the difference value $e_i$ and outputs a coding code $y_i$. The coding code $y_i$ is transmitted from an output terminal 16 to a transmission path. The coding code $y_i$ is also supplied to an inverse quantization unit 18. The inverse quantization unit 18 converts the coding code $y_i$ into a difference value (quantization representative value $Q(e_i)$). The predictive value is added to the quantization representative value $Q(e_i)$ by an adder 20, so that the input sample value can be restored. Since the restored input sample value $x_i$ includes a quantization error, there is a possibility that it may exceed a range of the original input sample value. Therefore, the range is amplitude limited by a limiter 22. An output of the limiter 22 is a local decoded value $\overline{x_i}$ which is input to a D flip-flop (predictor) 24. In the example, since the previous value decoded value is set to a predictive value, the predictor is constructed by a D flip-flop, that is, a delay circuit having a delay time corresponding to one sample period (one clock cycle). In the next clock cycle, the D flip-flop 24 supplies the local decoded value $\overline{x_i}$ as a predictive value to the subtracter 12 and adder 20. The predictive value for the sample value $x_i$ is written as $x_{ip}$ by adding a subscript "p".

Generally, a probability distribution of the difference values between the predictive values and the input sample values is one-sided in a portion which as a small value. The information amount can be compressed by finely setting quantization steps having a portion of a small difference and by coarsely setting (non-linear quantization) a portion which has a large difference.

However, in the conventional example, in the case where the difference value "0" is used as a quantization representative value and there are used midtread type quantization characteristics in which the quantization representative values are arranged symmetrically with respect to the positive and negative values, the number of quantization representative values is set to an odd number. On the other hand, since the number of quantization representative values which can be expressed by n bits is $2^n$, in the case where the DPCM code is set to an n-bit fixed length, one code remains. FIG. 2 is a diagram showing such midtread type quantization characteristics.

That is, for instance, assuming that a coding code consists of four bits, there are fifteen coding codes other than the coding code corresponding to the difference value "0". Seven coding codes are assigned to the positive quantization representative values, and seven to the negative quantization representative values. Therefore, the quantization steps become coarse and in the case of coding a video signal, there is a large possibility that a large quantization error is generated in the edge portion of an image, namely, what is called an edge business or the like occurs. On the other hand, when the quantization steps are daringly reduced, gradient overload noises or the like are generated.

On the other hand, in the case of using midriser type quantization characteristics in which the difference value "0" is not used as a quantization representative value, eight coding codes can be assigned to the positive quantization representative values and eight to the negative quantization representative values, and the quantization steps themselves can be relatively decreased. However, on a flat screen, in the case where the difference value "0" is not used as a quantization representative value, the decoded value changes in spite of the fact that the screen is flat, so that what is called a granular noise or the like easily occurs.

SUMMARY OF THE INVENTION

It is an object of the invention to solve the above problems under such circumstances.

Another object of the invention is to provide a coding device in which quantization steps can be reduced even in the case of forming coding codes on the basis of the midtread type quantization characteristics.

Under the above objects, according to the invention, as an embodiment, there is providing a coding device comprising: (a) input means for inputting a value to be quantized; and (b) quantizing means for converting the value to be quantized which was input from the input means into a coding code of n bits, wherein the quantizing means can output $(2^{n-1}-1)$ coding codes corresponding to positive quantization representative values, $(2^{n-1}-1)$ coding codes corresponding to negative quantization representative values, a coding code corresponding to the quantization representative value of a difference value "0", and a special coding code selectively corresponding responding to positive and to negative quantization representative values.

The above and other objects and features of the present invention will become apparent from the following detailed description with reference to the accompanying drawings.

DETAILED DESCRIPTION OF THE PREFERRED EMBODIMENTS

An embodiment of the present invention will be described hereinbelow with reference to the drawings.

Figure 1:
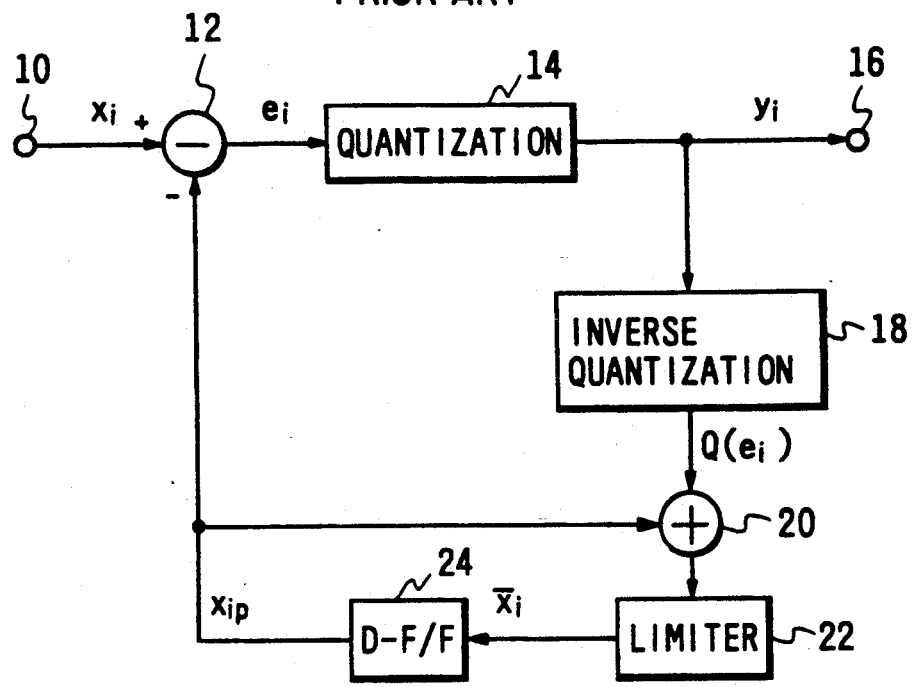
FIG. 1 is a block diagram showing a construction of a conventional general predictive coding device.
Figure 2:
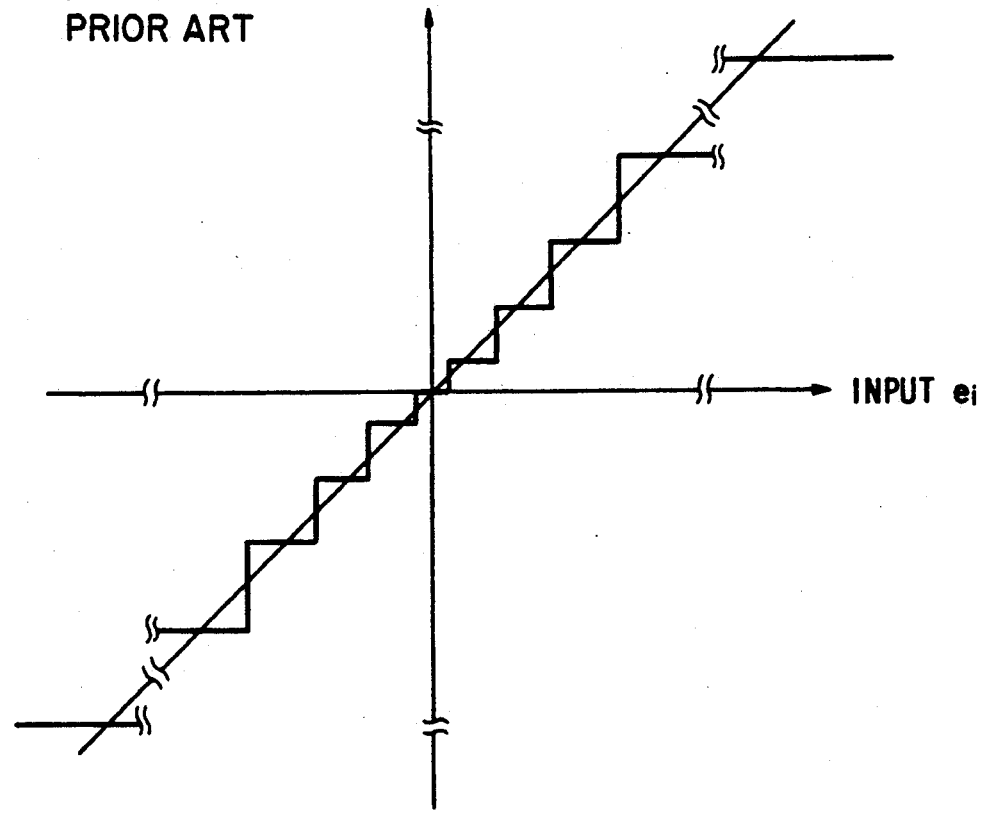
FIG. 2 is a diagram showing quantization characteristics of a midtread type.
Figure 3:
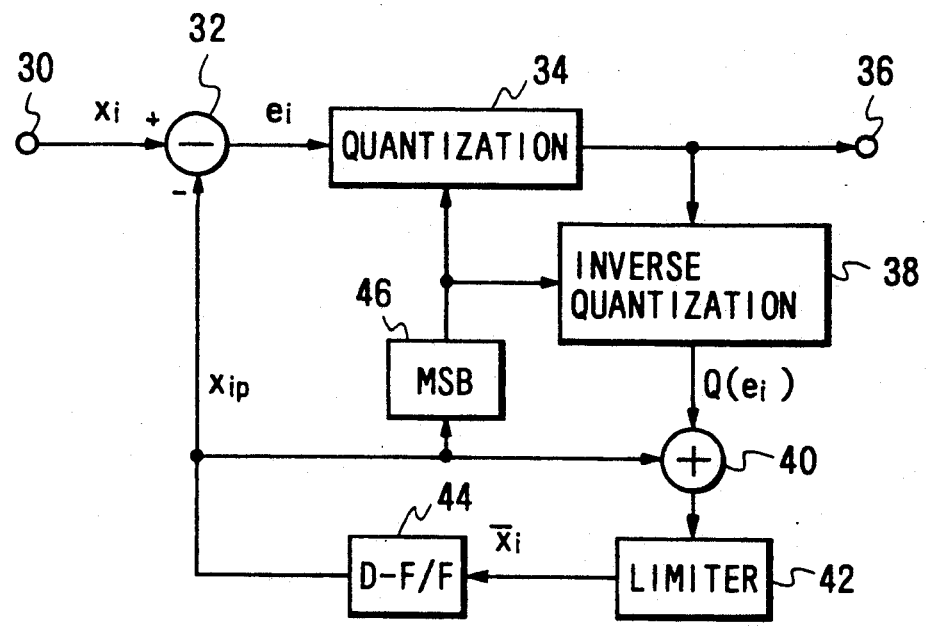
FIG. 3 is a block diagram showing a construction of a coding device as an embodiment of the invention.

FIG. 3 is a block diagram showing a construction of a coding device according to one preferred embodiment of the invention. Reference numeral 30 denotes an input terminal; 32 a subtracter; 34 a quantization unit; 36 an output terminal; 38 an inverse quantization unit; 40 an adder; 42 a limiter; 44 a D flip-flop serving as a predictor; and 46 an MSB extraction circuit to extract the most significant bit (MSB) of a predictive value.

The operation of the device of FIG. 3 will now be described. The subtracter 32 subtracts the predictive value $x_{ip}$ from the sample value $x_i$ which is input to the input terminal 30 and outputs the difference value $e_i$. In accordance with an MSB signal (the most significant bit of the predictive value) which is output from the MSB extraction circuit 46, the quantization unit 34 selects first quantization characteristics in which the number of coding codes corresponding to the negative quantization representative values, which will be explained hereinbelow is large when the MSB signal is set to "1", and the quantization unit 34 selects second quantization characteristics in which the number of coding codes corresponding to positive quantization representative values is large when the MSB signal is set to "0". Then, the quantization unit 34 quantizes the difference value $e_i$ and converts it into the DPCM code. The DPCM code which is output from the quantization unit 34 is transmitted from the output terminal 36 to a transmission path and is also input to the inverse quantization unit 38.

In response to the MSB signal output from the MSB extraction circuit 46, the inverse quantization unit 38 inversely converts the DPCM code into the quantization representative value (difference value) $Q(e_i)$ by the inverse quantization characteristics corresponding to the quantization characteristics in the quantization unit 34. The adder 40 adds the predictive value to the quantization representative value and the limiter 42 amplitude limits the addition signal from the adder 40. An output of the limiter 42 corresponds to the local decoded value $\overline{x_i}$ and is delayed until the next clock cycle by the D flip-flop 44 and is used as a predictive value for the next sample value and is supplied to the subtracter 32, MSB extraction circuit 46, and adder 40.

The reason why the quantization characteristics are selected by the MSB signal output of the MSB extraction circuit 46 will now be described on the basis of numerical values. Table 1 shows an example of the quantization characteristics (first quantization characteristics) in the case where the MSB of the predictive value is set to "1". Table 2 shows an example of the quantization characteristics (second quantization characteristics) in the case where the MSB of the predictive value is set to "0". In this case, it is assumed that the input sample value consists of seven bits (and so can have decimal values from 0 to 127) and the DPCM code consists of three bits.

As mentioned above, assuming that the difference value "0" was first assigned as a representative value and the same number of positive and negative representative values were assigned, one code remains unassigned ("100" in Tables 1 and 2). Therefore, in this embodiment, attention is paid to the predictive value and the following processes are executed. That is, assuming that the predictive value for the input sample value $x_i$ is $x_{ip}$, the predictive error (difference value) is $e_i$ and the maximum value and the minimum value of the input sample value are $x_{max}$ and $x_{min}$, respectively, $$x_{min} - x_{ip} \leq e_i \leq x_{max} - x_{ip} \quad (1)$$

When an $x_{ip}$ which satisfies the following equation $$|x_{ip} - x_{min}| = |x_{max} - x_{ip}|$$

is obtained, $$x_{ip} = (\tfrac{1}{2})(x_{max} + x_{min}) \quad (2)$$

Now, assuming that $x_{max} = 127$ and $x_{min} = 0$, $x_{ip} = 63.5$ from the equation (2). Therefore, it will be understood that when $x_{ip} \geq 64$, the negative range of the predictive error $e_i$ is larger and when $x_{ip} < 64$, the positive range is larger.

TABLE 1

| (MSB = "0") | | |
|---|---|---|
| Range | Representative value | Code |
| ~33 | 42 | 100 |
| 32~17 | 23 | 011 |
| 16~7 | 10 | 010 |
| 6~2 | 3 | 001 |
| 1~−1 | 0 | 000 |
| −2~−6 | −3 | 101 |
| −7~−16 | −10 | 110 |
| −17~ | −23 | 111 |

On the other hand, it is known that assuming that the maximum value of the difference value is set to $e_{max}$ and the maximum value of the quantization representative value is set to $Q(e_{max})$, the gradient overload can be almost ignored if $Q(e_{max}) \geq (\tfrac{1}{3})e_{max}$. In the above example, since $e_{max} = 127$, $Q(e_{max}) \geq 127/3 \approx 42$. In order to eliminate the influence of the gradient overload, a quantization representative value of 42 is necessary. On the other hand, the gradient overload easily occurs in a larger range of the difference value. Therefore, when $x_{ip} \geq 64$, the negative quantization representative value (−42) is assigned to a code "100". When $x_{ip} < 64$, the positive quantization representative value (42) is assigned to a code "100". The predictive value consists of seven bits. When 64 is expressed by a binary number, it is expressed by "1000000". Therefore, the above discrimination can be performed on the basis of the most significant bit (MSB) of the predictive value. In this embodiment, therefore, the quantization circuit 34 and inverse quantization circuit 38 switch, based on the MSB, between first and second modes, in which the last coding code is made to correspond to positive, or to negative, quantization representative values, respectively.

TABLE 2

| Range | Representative value (MSB = "1") | Code |
| --- | --- | --- |
| ~17 | 23 | 011 |
| 16~7 | 10 | 010 |
| 6~2 | 3 | 001 |
| 1~-1 | 0 | 000 |
| -2~-6 | -3 | 101 |
| -7~-16 | -10 | 110 |
| -17~-32 | -23 | 111 |
| -33~ | -42 | 100 |

Figure 4:
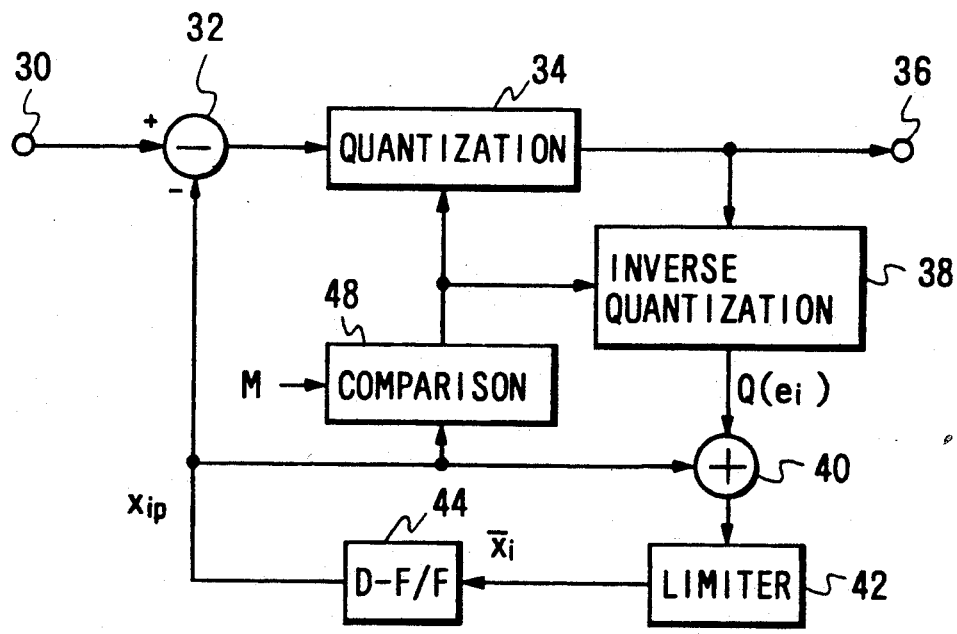
FIG. 4 is a block diagram showing a construction of a coding device as another embodiment of the invention.

In the case of the video signal, since a signal of a certain level or less is used as a sync signal, the minimum value is not always set to 0. In this case, if the last quantization representative value is assigned by the MSB of the predictive value, there is a possibility that the quantization representative value may be assigned to a narrow range. FIG. 4 is an arrangement block diagram of the second embodiment of the invention, which copes with such a situation. In FIG. 4, the same components as those shown in FIG. 3 are designated by the same reference numerals. The second embodiment differs from the first embodiment of FIG. 3 in that a comparison circuit 48 is used in place of the MSB extraction circuit 46.

A different point from FIG. 3 will now be described. Both the predictive value $x_{ip}$ and a central value M of the range of the input sample value are input to the comparison circuit 48. The comparison circuit 48 outputs "1" when $x_{ip}$ is larger than M. The comparison circuit 48 outputs "0" when $x_{ip}$ is equal to or smaller than M. An output of the comparison circuit 48 is supplied to the quantization unit 34 and inverse quantization unit 38 in a manner similar to the output of the MSB extraction circuit 46. The quantization unit 34 and inverse quantization unit 38 select the characteristics on the side in which the range of the negative quantization representative values is wider when the output of the comparison circuit 48 is set to "1", while they select the characteristics on the side in which the range of the positive quantization representative values is wider when the output of the comparison circuit 48 is set to "0". In this embodiment also, therefore, circuits 34 and 38 act to switch the device between first and second modes.

The operation will now be practically explained hereinbelow. From the equation (2), when $x_{min}=16$, $x_{ip}=(127+16)/2=71.5$. When the predictive value $x_{ip}$ is 72 or more, the negative range of the predictive error $e_i$ is large. When the predictive value $x_{ip}$ is smaller than 72, the positive range of $e_i$ is large. Therefore, it is sufficient that the assigning method of the last quantization representative value is determined on the basis of the comparison between the magnitudes of the predictive value $x_{ip}$ and the above value 72. Therefore, both the predictive value $x_{ip}$ and the central value M of the input sample value, that is, $(\frac{1}{2})(x_{max}+x_{min})$, are input to the comparing circuit 48 and are compared. On the basis of the result of the comparison, the last quantization representative value, that is, the quantization representative value corresponding to the coding code "100" in the example of Tables 1 and 2 is assigned.

Although the present embodiment has been described above with respect to the case where the positive and negative quantization representative values were symmetrically assigned, the invention is not limited to the above example. A similar effect is obtained if the range of the quantization representative values in the wider range of the difference values is widened when the last representative value was assigned. Also, in the above embodiment, the previous value prediction has been used as a predicting method. However, the invention is not limited to such a predicting method but can be also applied to other predicting methods such as two-dimensional prediction, three-dimensional prediction, adaptive prediction, and the like.

As will be easily understood from the above description, according to the invention, the picture quality (particularly, the gradient overload characteristics) after completion of the decoding can be remarkably improved without increasing the amount of information to be transmitted at all.

I claim:
1. A coding device comprising:
   (a) input means for inputting a value to be quantized;
   (b) quantizing means for converting the value to be quantized which was input via the input means into a coding code of n bits,
   the quantizing means being structured and arranged to be able to output $2^n$ coding codes which include $(2^{n-1}-1)$ coding codes corresponding to $(2^{n-1}-1)$ coding codes quantization representative values, $(2^{n-1}-1)$ coding codes corresponding to $(2^{n-1}-1)$ negative quantization representative values, a coding code corresponding to the quantization representative value of a difference value "0", and a last coding code; and
   (c) switching means for switching the quantizing means between a first mode to make the last coding code correspond to a positive quantization representative value and a second mode to make the last coding code correspond to a negative quantization representative value.
2. A device according to claim 1, wherein the input means includes:
   an arithmetic operating circuit for providing the difference value of a sample value and its predictive value as the value to be quantized to the quantizing means;
   an inverse quantization circuit for converting the coding code into the quantization representative value corresponding to the difference value;
   a decoding circuit for providing a decoded value by using both an output of the inverse quantization circuit and the predictive value; and
   a predicting circuit for forming the predictive value by using the decoded value.
3. A device according to claim 2, wherein the switching means switches the quantizing means between the first and second modes in according with whether the predictive value is at least a predetermined value or not.
4. A device according to claim 3, wherein the switching means includes a circuit to extract the most significant bit of the predictive value.
5. A device according to claim 3, wherein the switching means includes a comparison circuit to compare the predictive value and the predetermined value.
6. A coding device comprising:
   (a) input means for inputting a value to be quantized;
   (b) quantizing means for converting the value to be quantized which was input from the input means into a coding code of n bits.
   the quantizing means being structured and arranged to be able to output $2^n$ coding codes which include

($2^n-1$) coding codes corresponding to respective predetermined quantization representative values in accordance with positive and negative symmetrical midtread type quantization characteristics and a last coding code;

(c) switching means for switching the quantizing means between a first mode to make the last coding code correspond to the positive quantization representative value and a second mode to make the last coding code correspond to the negative quantization representative value.

7. A device according to claim 6, wherein the input means includes:

arithmetic operating circuit for providing a difference value between a sample value and its predictive value as the value to be quantized to the quantizing means;

an inverse quantization circuit to convert the coding code into the quantization representative value corresponding to the difference value;

a decoding circuit for providing a decoded value by using an output of the inverse quantization circuit and the predictive value; and a predicting circuit to form the predictive value by using the decoded value.

8. A device according to claim 7, wherein the switching means switches the quantizing means between the first and second modes in accordance with whether the predictive value is at least a predetermined value or not.

9. A coding device comprising:

(a) an inputting circuit to input a sample value;

(b) an arithmetic operating circuit to provide a difference value between the sample value and its predictive value;

(c) a quantization circuit to convert the difference value into a coding code;

(d) a discriminating circuit to discriminate whether a range of values to which the difference value can be set is wider for positive values or for negative values; and (e) a switching circuit to switch the quantization circuit in accordance with an output of the discriminating circuit between a first mode in which the number of coding codes corresponding to the positive quantization representative values is larger than the number of coding codes corresponding to negative quantization representative values and a second mode in which the number of coding codes corresponding to the negative quantization representative values is larger than the number of coding codes corresponding to the positive quantization representative values.

10. A device according to claim 9, wherein the switching circuit switches the quantization circuit between the first and second modes in accordance with whether the predictive value is at least a predetermined value or not.

11. A device according to claim 10, wherein the switching circuit includes a circuit to extract the most significant bit of the predictive value.

12. A device according to claim 10, wherein the switching circuit includes a comparison circuit to compare the predictive value and the predetermined value.

13. A device according to claim 9, wherein in the first and second modes, all of the coding codes excluding the special coding code correspond to common quantization representative values.

* * * * *

UNITED STATES PATENT AND TRADEMARK OFFICE
CERTIFICATE OF CORRECTION

PATENT NO. : 5,115,241

DATED : May 19, 1992

INVENTOR(S) : HISASHI ISHIKAWA

It is certified that error appears in the above-identified patent and that said Letters Patent is hereby corrected as shown below: On title page,

IN [56] REFERENCES CITED

Under U.S. PATENT DOCUMENTS, "Takebayshi et al."
       should read --Takebayashi et al.--.

IN [57] ABSTRACT

Line 1, "which" should read --which,--.
   Line 11, "selective" should read --selectively--.

COLUMN 1

Line 9, "signal" (second occurrence) should read --signal,--
      and "like" should read --like,--.
   Line 64, "as" should read --has--.
   Line 66, "having a portion of" should read
      --of a portion having--.
   Line 68, "which has" should read --having--.

COLUMN 2

Line 11, "remains." should read --remains unused.--.
   Line 25, "daringly" should read --greatly--.
   Line 59, "responding" should be deleted.

COLUMN 3

Line 29, "the" should be deleted.
   Line 31, "hereinbelow" should read --hereinbelow,--.

COLUMN 4

Line 67, "respective." should read --respectively.--.

UNITED STATES PATENT AND TRADEMARK OFFICE
CERTIFICATE OF CORRECTION

PATENT NO.   : 5,115,241
DATED        : May 19, 1992
INVENTOR(S)  : HISASHI ISHIKAWA

It is certified that error appears in the above-identified patent and that said Letters Patent is hereby corrected as shown below:

COLUMN 5

Line 13, "the video" should read --a video-- and "a signal" should read --the signal--.
    Line 59, "paring" should read --parison--.
    Line 63, "2 is" should read --2, is--.

COLUMN 6

Line 19, "(b)quantizing" should read --(b) quantizing--.
    Line 25, "coding codes" should read --positive--.
    Line 54, "according" should read --accordance--.

Signed and Sealed this

Sixteenth Day of November, 1993

Attest:

BRUCE LEHMAN

Attesting Officer     Commissioner of Patents and Trademarks